(12) United States Patent
Biber et al.

(10) Patent No.: US 10,101,418 B2
(45) Date of Patent: Oct. 16, 2018

(54) FLEXIBLE SIGNAL MULTIPLEXER FOR MRI RECEIVING SYSTEMS

(71) Applicants: Stephan Biber, Erlangen (DE); Jan Bollenbeck, Eggolsheim (DE)

(72) Inventors: Stephan Biber, Erlangen (DE); Jan Bollenbeck, Eggolsheim (DE)

(73) Assignee: Siemens Aktiengesellschaft, München (DE)

( * ) Notice: Subject to any disclaimer, the term of this patent is extended or adjusted under 35 U.S.C. 154(b) by 495 days.

(21) Appl. No.: 14/842,033

(22) Filed: Sep. 1, 2015

(65) Prior Publication Data

US 2016/0077174 A1  Mar. 17, 2016

(30) Foreign Application Priority Data

Sep. 12, 2014 (DE) .................. 10 2014 218 281

(51) Int. Cl.
*G01R 33/36* (2006.01)

(52) U.S. Cl.
CPC ..... *G01R 33/3621* (2013.01); *G01R 33/3664* (2013.01)

(58) Field of Classification Search
CPC .................. G01R 33/3621; G01R 33/3664
See application file for complete search history.

(56) References Cited

U.S. PATENT DOCUMENTS

| | | | |
|---|---|---|---|
| 5,572,130 A | 11/1996 | Ratzel | |
| 6,181,135 B1 | 1/2001 | Shen | |
| 2005/0127914 A1 | 6/2005 | Eberler et al. | |
| 2009/0286478 A1 | 11/2009 | Biber et al. | |
| 2010/0148778 A1 | 6/2010 | Biber | |
| 2014/0361775 A1* | 12/2014 | Qiu | G01R 33/3664 324/309 |

FOREIGN PATENT DOCUMENTS

| | | |
|---|---|---|
| DE | 4412446A1 A1 | 10/1995 |
| DE | 10314215 B4 | 11/2006 |
| DE | 102008063460 A1 | 7/2010 |
| DE | 102008023467 B4 | 6/2012 |
| DE | 102014206311 B3 | 10/2015 |

OTHER PUBLICATIONS

German Exam Report for related German Application No. 10 2014 218 281.6 dated Aug. 16, 2017.
German Office Action for related German Application No. 10 2014 218 281.6 dated Jun. 1, 2017.

(Continued)

*Primary Examiner* — Gregory H Curran

(74) *Attorney, Agent, or Firm* — Lempia Summerfield Katz LLC

(57) ABSTRACT

The embodiments relate to a method and a receiving system for an imaging magnetic resonance tomography system. The receiving system includes at least one multiplexer entity for a plurality of receive signals, which respectively come from an antenna of a local coil and may be switched to an analog-digital converter, wherein sampling rates (e.g., 20 MS/s per Ch, 40 MS/s per Ch, 80 MS/s per Ch) of an analog-digital converter for the sampling of a receive signal may be changed.

19 Claims, 6 Drawing Sheets

(56) References Cited

OTHER PUBLICATIONS

Gabr R. E. et. al., "MRI Dynamic Range: Theory and Measurement," in: Proc. Intl. Soc. Mag. Reson. Med., vol. 16, 2008.
Gabr Refaat E. et. al., "MRI dynamic range and its compatibility with signal transmission media," in: Journal of Magnetic Resonance, vol. 198, pp. 137-145, 2009.
German Office action for related German Application No. 10 2014 218 281.6, dated Jun. 17, 2015, with English Translation.
Weinzierl, Stefan, Kommunikationstechnik II, TU Berlin, Kap. 2.5, 2006.

* cited by examiner

FLEXIBLE SIGNAL MULTIPLEXER FOR MRI RECEIVING SYSTEMS

CROSS-REFERENCE TO RELATED APPLICATIONS

This application claims the benefit of DE 10 2014 218 281.6, filed on Sep. 12, 2014, which is hereby incorporated by reference in its entirety.

TECHNICAL FIELD

The embodiments relate to receiving systems and methods for a magnetic resonance tomography device.

BACKGROUND

Magnetic resonance devices (MRTs) for examining objects or patients by magnetic resonance tomography are disclosed in DE 10 314 215 B4; DE 10 2008 023 467 B4; DE 10 2014 206 311; Gabr et al., "MRI dynamic range and its compatibility with signal transmission media," Journal of Magnetic Resonance, Vol. 198, pp. 137-145 (2009); Gabr et al., "MRI Dynamic Range: Theory and Measurement," Proc. Intl. Soc. Mag. Reson. Med., Vol. 16, p. 1129 (2008); Weinzierl, "Kommunikationstechnik II," Chapter 2.5, TU Berlin.

SUMMARY

The scope of the present invention is defined solely by the appended claims and is not affected to any degree by the statements within this summary. The present embodiments may obviate one or more of the drawbacks or limitations in the related art.

The object of the present embodiments is to optimize the reception in a magnetic resonance tomography device.

DETAILED DESCRIPTION

Figure 5:
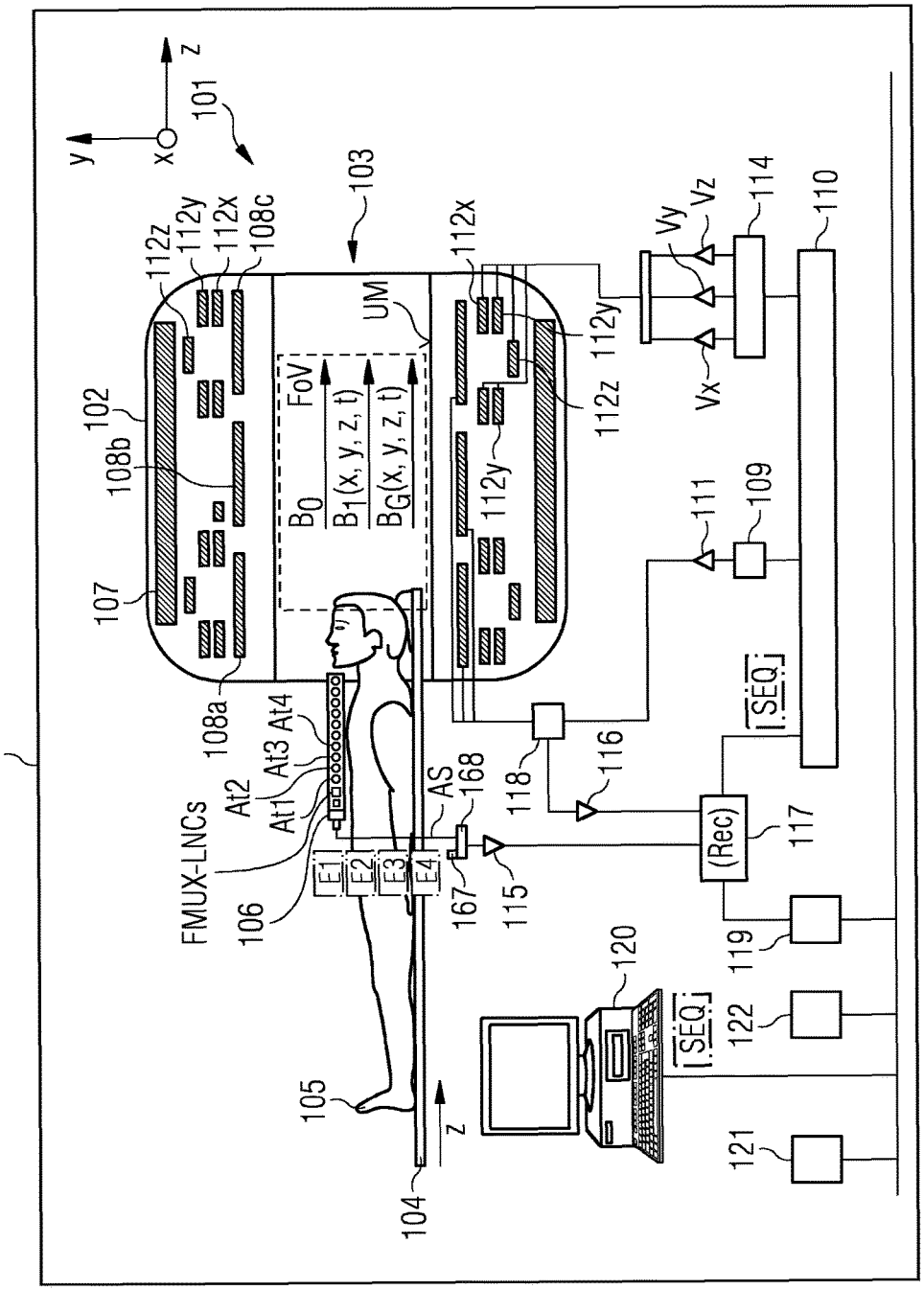
FIG. 5 schematically depicts an example of a MRT system.

FIG. 5 depicts an imaging magnetic resonance device MRT 101 in a screened space or Faraday cage F. The device includes a hollow cylinder 102 having a tube-shaped space 103 into which a patient couch 104 and a body 105 (e.g., an examination object or a patient) (with or without local coil arrangement 106) may be moved in the direction of the arrow z, in order to generate recordings of the body 105 by an imaging method. A local coil arrangement 106 is arranged on the patient here, allowing recordings to be generated in a local region (also referred to as field of view or FoV) of the MRT, for a partial region of the body 105 in the FoV. Signals from the local coil arrangement 106 may be analyzed (e.g., converted into images, stored, or displayed) by a receiver (Rec) of the MRT 101, the receiver being attached to the local coil arrangement 106 via coaxial cable, for example.

In order to examine a body 105 (e.g., an examination object or a patient) by magnetic resonance imaging using a magnetic resonance device MRT 101, various magnetic fields are applied to the body 105, the magnetic fields being coordinated as accurately as possible in respect of their temporal and spatial characteristics. A strong magnet (e.g., a cryomagnet 107) in a measurement cubicle, having a tunnel-shaped opening 103 in this case, generates a static strong main magnetic field $B_0$ of, e.g., 0.2 to 3 Tesla or even more. Supported on a patient couch 104, a body 105 to be examined is moved into a field of view (FoV) of an approximately homogeneous region of the main magnetic field $B_0$. Excitation of the nuclear spin of atomic nuclei of the body 105 is produced by magnetic high-frequency excitation pulses $B_1(x, y, z, t)$, beamed in via a high-frequency antenna (and/or possibly a local coil arrangement) that is illustrated here as body coil 108 (e.g., multipart=108a, 108b, 108c). High-frequency excitation pulses are generated by a pulse generation unit 109, for example, which is controlled by a pulse sequence control unit 110. Following amplification by a high-frequency amplifier 111, the pulses are forwarded to the high-frequency antenna 108. The high-frequency system depicted here is outlined only schematically. It is also possible to use more than one pulse generation unit 109, more than one high-frequency amplifier 111, and a plurality of high-frequency antennas 108a, b, c in a magnetic resonance device 101.

The magnetic resonance device 101 also includes gradient coils 112x, 112y, 112z by which magnetic gradient fields $B_G(x, y, z, t)$ are beamed in for selective slice excitation and for spatial encoding of the measurement signal during a measurement. The gradient coils 112x, 112y, 112z are controlled by a gradient coil control unit 114 (and possibly amplifiers Vx, Vy, Vz) that, in the same way as the pulse generation unit 109, is connected to the pulse sequence control unit 110.

Signals emitted by the excited nuclear spin (of the atomic nuclei in the examination object) are received by the body coil 108 and/or at least one local coil arrangement 106, amplified by an assigned high-frequency preamplifier 116 (and optionally converted into a intermediate frequency range), and further processed and digitized by a receiver unit 117. The recorded measurement data is digitized and stored in a k-space matrix as complex numerical values. An associated MR image may be reconstructed from the k-space matrix and values therein by a multidimensional Fourier transform.

In the case of a coil that may be operated in both transmit mode and receive mode, (such as, e.g., the body coil 108 or a local coil 106), the correct signal forwarding is regulated by a series-connected transmit/receive program switch 118.

An image processing unit 119 generates an image from the measurement data and the image is displayed to a user via an operator console 120 and/or stored in a storage unit 121. A central computer unit 122 controls the individual components of the installation.

In the field of MR tomography today, images having a high signal/noise ratio (SNR) may be recorded with the aid of so-called local coil arrangements (e.g., coils, local coils). These are antenna systems positioned in the immediate vicinity on top of (e.g., anterior), underneath (e.g., posterior), on the body 105, or in the body 105. During a MR measurement, the excited nuclei induce a voltage in the individual antennas of the local coil, the voltage being then amplified using a low-noise preamplifier (e.g., LNA, pre-amp) and forwarded to the receiver electronics. In order to improve the signal/noise ratio for high-resolution images also, use is made of so-called high-field installations (e.g., 1.5 T to 12 T or more). If more individual antennas may be attached to a MR receiving system than there are receivers, e.g., a switch matrix is included between receive antennas and receivers. This routes the currently active receive channels (e.g., those situated precisely in the field of view of the magnet) to the available receivers. It is therefore possible to attach more coil elements than there are receivers, since in the case of total body coverage it is only necessary to read out those coils situated in the FoV or in the homogeneity volume of the magnet.

A local coil arrangement 106 may refer to an antenna system that may include one antenna element or a plurality of antenna elements (e.g., coil elements) in the form of an array coil. These individual antenna elements are embodied as, e.g., loop antennas (loops), butterflies, flexible coils, or saddle coils. A local coil arrangement may include coil elements, a preamplifier, further electronics (e.g., sheath wave barriers, etc.), a housing, supports, and, in certain examples, a cable and plug by which they are attached to the MRT installation. A receiver 117 (Rec) attached as part of the installation filters and digitizes a signal that is transferred from a local coil 106, e.g., via coaxial cable, and passes the data to a digital signal processing entity, which may derive an image or a spectrum from the data obtained by measurement, and makes the image or spectrum available to the user for the purpose of subsequent diagnosis and/or storage, for example.

When designing a receiving system for a MR system, one challenge is to realize the required amplitude dynamic range. The amplitude dynamic range extends from the noise floor to the maximum level that still just allows adequately linear signal processing. The system noise floor is specified by entering a noise figure. The maximum permitted signal level is defined as that beyond which the RX system may no longer process the signal correctly. In other words, the signal may be distorted (e.g., compression, intermodulation) or that clipping may occur as a result of the analog-digital converter being operated at its upper limit.

The largest signals in MR imaging occur in the center of the k-space. The echo of all spins comes into phase there. The thicker the slices, the higher the signal amplitude. Maximum amplitudes occur for non-selective excitations and high flip angles, e.g., for 3D sequences such as SPACE or for SE, TSE sequences with considerable slice thickness (see also "MRI dynamic range and its compatibility with signal transmission media" and "MRI Dynamic Range: Theory and Measurement") and, in particular, for contrasts with short echo times (T1, PD) on.

The receive signal is particularly high in the case of large coils (e.g., 1-channel: body coil, volume coil for head, knee, abdomen: array coils: coils having limited coil density and large coil elements, such as 2 to 4-channel coils) with a high fill factor.

The configuration of the upper dynamic limit is critical to defining the selection of components, their power consumption and their costs.

Existing receiving systems having high numbers of channels are configured such that all channels may realize their maximum dynamic range. A higher number of channels with a smaller dynamic range per channel are also possible.

For example, the RX signal level (e.g., per channel) for a 1-channel head coil (e.g., birdcage volume coil) may be approximately 3 to 10 dB greater than is the case for a 12 to 20-channel coil, e.g., in existing M1-M2 products. The RX system of installations today, however, is capable of processing the whole signal dynamic range on all channels, though this is practically never utilized.

A fundamental question here may be how to configure the RX system in such a way that the decreasing demand on the dynamic range, which accompanies the increasing number of channels, may be used to optimize the RX system (e.g., costs, DG performance, component selection).

Examples of existing solutions for achieving a high dynamic range are as follows: (1) Gain switching: operating in "HighGain" mode for small signals and "LowGain" mode for large signals; switching between two echoes or between two sequences. (2) Analog dynamic compressor: instantaneous decrease in amplification as the signal level increases; automatic dynamic configuration of the amplification from one sample to the next sample.

Existing solutions for scaling dynamic range versus number of channels are not found.

For example, time multiplexing methods and frequency multiplexing methods (and combinations of both methods) are used in the receive path of MRI systems in order to restrict the number of signal lines required (e.g., from the local coils to the receivers, LC→RX) and the ADC modules in the receiver (cf. DE 10 2008 023 467 B4 and DE 10 2014 206 311.6).

Figure 2:
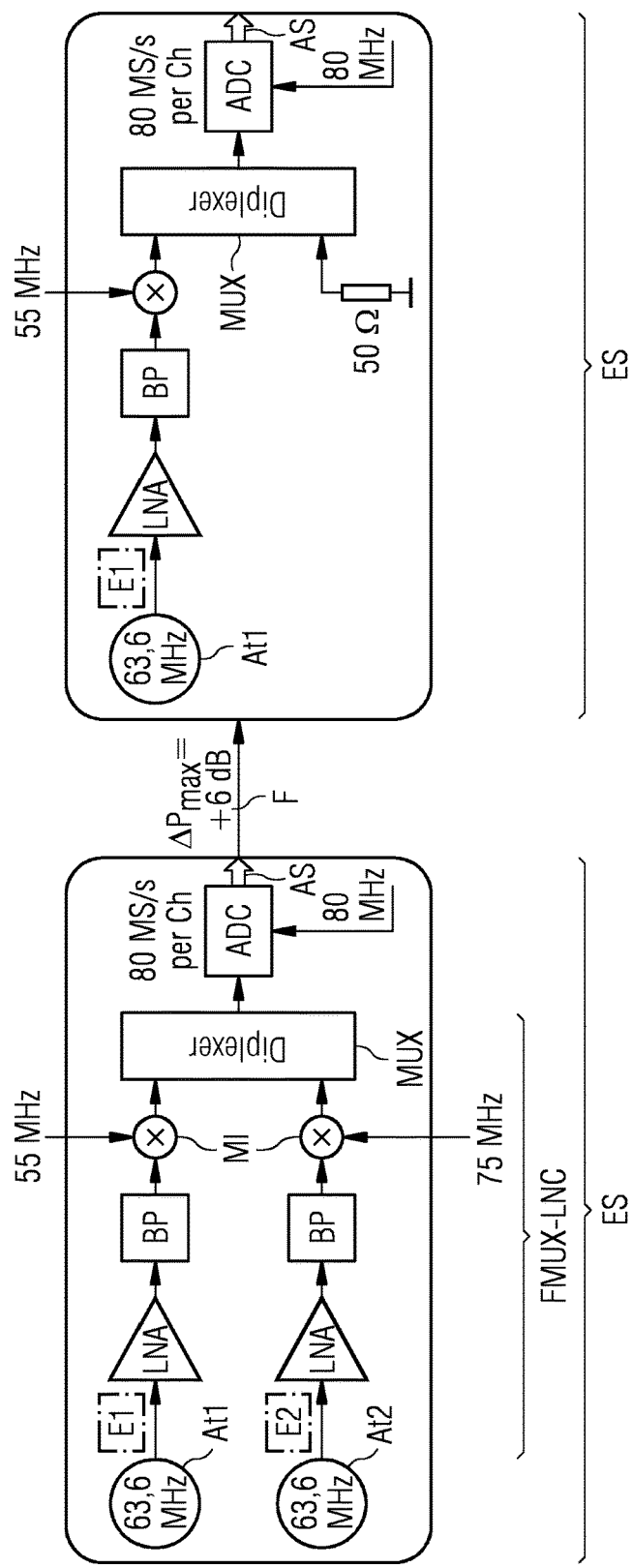
FIG. 2 depicts an example of a receiving system configured with two incoming signals (e.g., with 2:1 frequency multiplexing via a diplexer) on the left-hand side, and such a receiving system configured with one incoming signal (e.g., no frequency multiplexing) on the right hand side.

As a result of merging a plurality of signal paths into a shared signal path, the requirement on the usable dynamic range of the shared signal path increases:

Frequency multiplexing is depicted, for example, in FIG. 2. Since the signal voltage amplitudes of the M (e.g., M=2 in FIG. 2) individual signals E1, E2 on the shared signal path AS may be structurally superimposed, the signal dynamic range of the combined signal increases relative to the dynamic range of the individual signals by 20×log(M) (assuming equally large peak signal amplitudes of the individual signals).

For example, the combined signal (e.g., into AS) of a 2:1 frequency multiplexing system as per the left-hand side of FIG. 2 has a maximum voltage amplitude that is greater by a factor of two than the part signals E1, E2 (assuming equally large peak signal amplitudes of the individual signals). This corresponds to an increase of +6 dB. If the upper operating limit of the ADC is unchanged, the usable dynamic range per signal path therefore decreases by a factor of $1/M^2$, or 20×log(1/M) [dB].

On the left-hand side of FIG. 2, signals E1, E2 from antennas At1, At2 of at least one local coil are amplified in each case by an amplifier LNA, filtered by a bandpass BP, shifted to another frequency band by mixer MI using frequencies of 55 MHz and 75 MHz respectively, multiplexed by a diplexer MUX, and analog-digital converted by an ADC using a sampling rate of 80 MS/s and 80 MS/s per channel, for example. On the right-hand side of FIG. 2, only one signal E1 of an antenna At1 is analyzed (the other diplexer input is connected to ground via 50 Ohms) The input signal E1 may therefore have a maximum sampling amplitude that is twice as high (+6 dB) as that on the left-hand side of FIG. 2 before the ADC (which is identical to that depicted on the left-hand side of FIG. 2) is overloaded. The receiving system depicted on the right-hand side of FIG. 2 therefore has a dynamic range that is +6 dB higher than the receiving system depicted on the left-hand side of FIG. 2.

Figure 1:
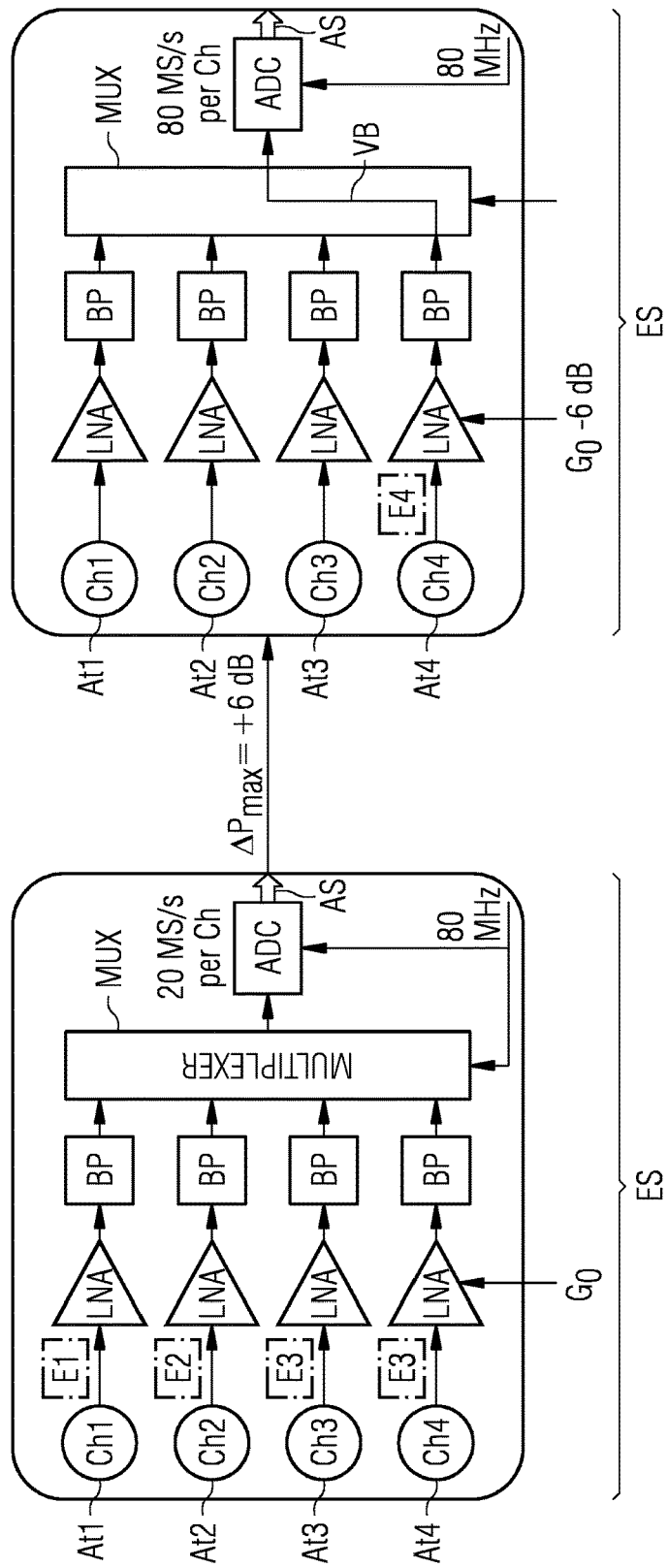
FIG. 1 depicts an example of a receiving system configured with four incoming signals (e.g., with 4:1 time multiplexing) on the left-hand side, and such a receiving system configured with only one incoming signal (e.g., no time multiplexing) on the right hand side.

Time multiplexing with synchronous sampling is depicted, for example, in FIG. 1. In the case of conventional Nyquist sampling, the quantization noise generated by quantization errors is distributed uniformly over the so-called Nyquist bandwidth (e.g., DC to FS/2; FS: sampling rate), see e.g. "Kommunikationstechnik II", chapter 2.5, Prof. Dr. Stefan Weinzierl, TU Berlin. As a result of using a time multiplexing method, the signal path-specific sampling rate of the analog-digital conversion is reduced by a factor of 1/M. In other words, the quantization noise is distributed over a Nyquist bandwidth reduced by a factor of 1/M. The level of the quantization noise is independent of the sampling rate. Therefore, the spectral density of the noise power (noise power density) increases in a manner inversely proportional to the decreasing sampling rate (or bandwidth), e.g., by the factor M. This corresponds to the ADC noise floor increasing by the factor M. If the upper operating limit of the ADC is unchanged, the usable dynamic range per signal path therefore decreases by a factor of 1/M or by $10 \times \log(1/M)$ [dB].

On the left-hand side of FIG. 1, signals E1, E2, E3, E4 from antennas At1, At2, At3, At4 of at least one local coil are amplified in each case by an amplifier LNA (Low Noise Amplifier), filtered by a bandpass BP, multiplexed in the time domain by a multiplexer MUX (e.g., multiplexer factor M=4), and analog-digital converted by an analog-digital converter ADC at, e.g., 80 MS/s and therefore 20 MS/s per channel. On the right-hand side of FIG. 1, only one signal E4 of an antenna At4 is analyzed, and is therefore analog-digital converted by an ADC (which is identical to that depicted on the left-hand side of FIG. 1) at a sampling rate (e.g., likewise 80 MS/s) that is M-fold (e.g., four times) higher than it is in the case of four signals. In relation to the signal E4, the ADC of the receiving system depicted on the right-hand side of FIG. 1 therefore has a noise floor that is −6 dB lower and therefore a dynamic range that is +6 dB higher than the ADC of the receiving system depicted on the left-hand side of FIG. 1. As a result of reducing the cascade amplification (e.g., LNA amplification $G_0$) ahead of the ADC by $10 \times \log(1/M)$ ($G_0$−6 dB), it is possible to render the increased dynamic range in the receiving system almost fully usable without increasing the noise figure of the receiving system (specified precondition: noise figure of the ADC>>1 and noise figure of the LNA largely independent of the selected LNA amplification).

Figure 3:
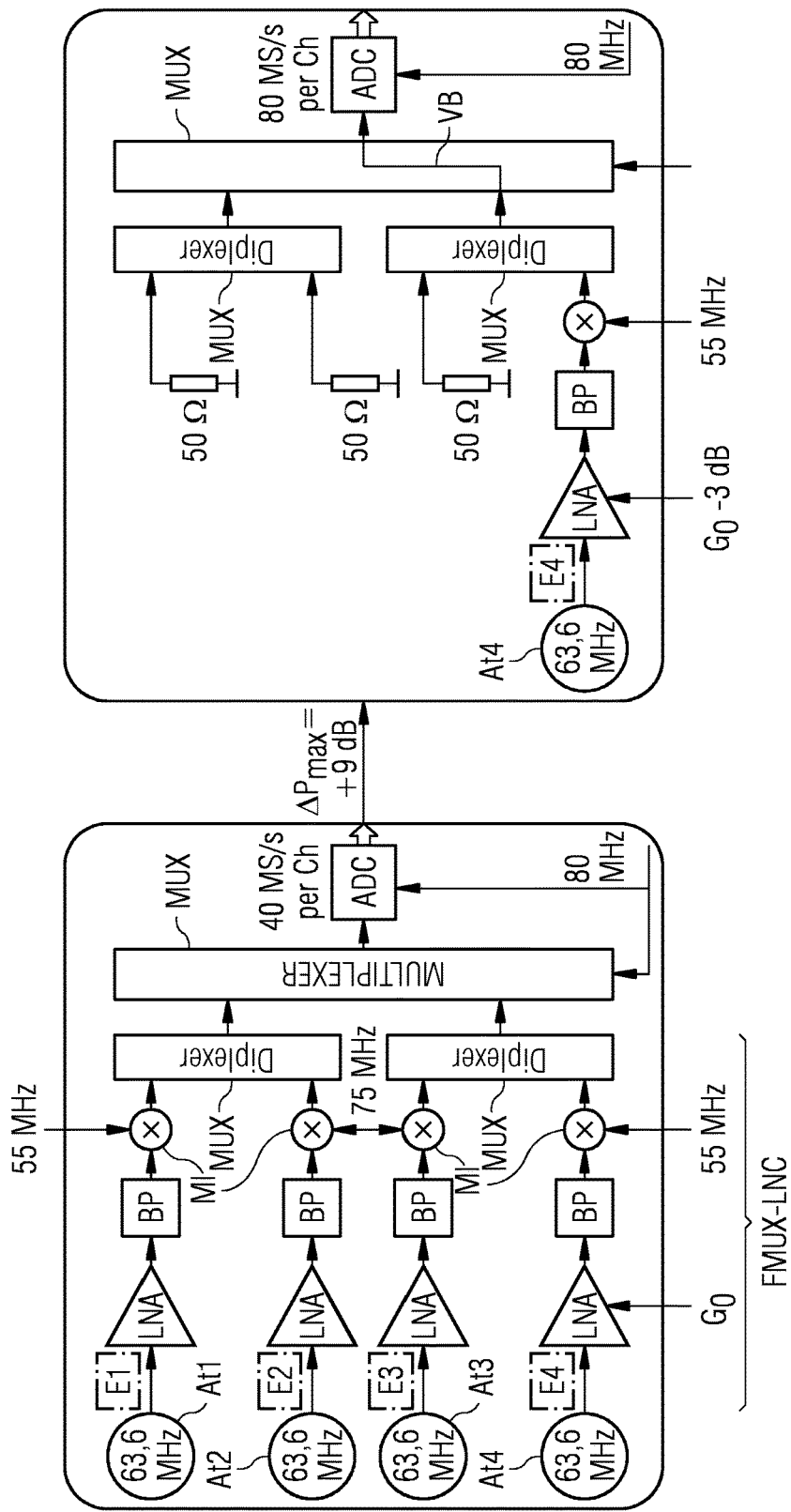
FIG. 3 depicts an example of a receiving system configured with four incoming signals (cascaded from twice 2:1 frequency multiplexing and 2:1 time multiplexing) on the left-hand side, and such a receiving system configured with only one incoming signal (without multiplexing) on the right hand side.
Figure 4A:
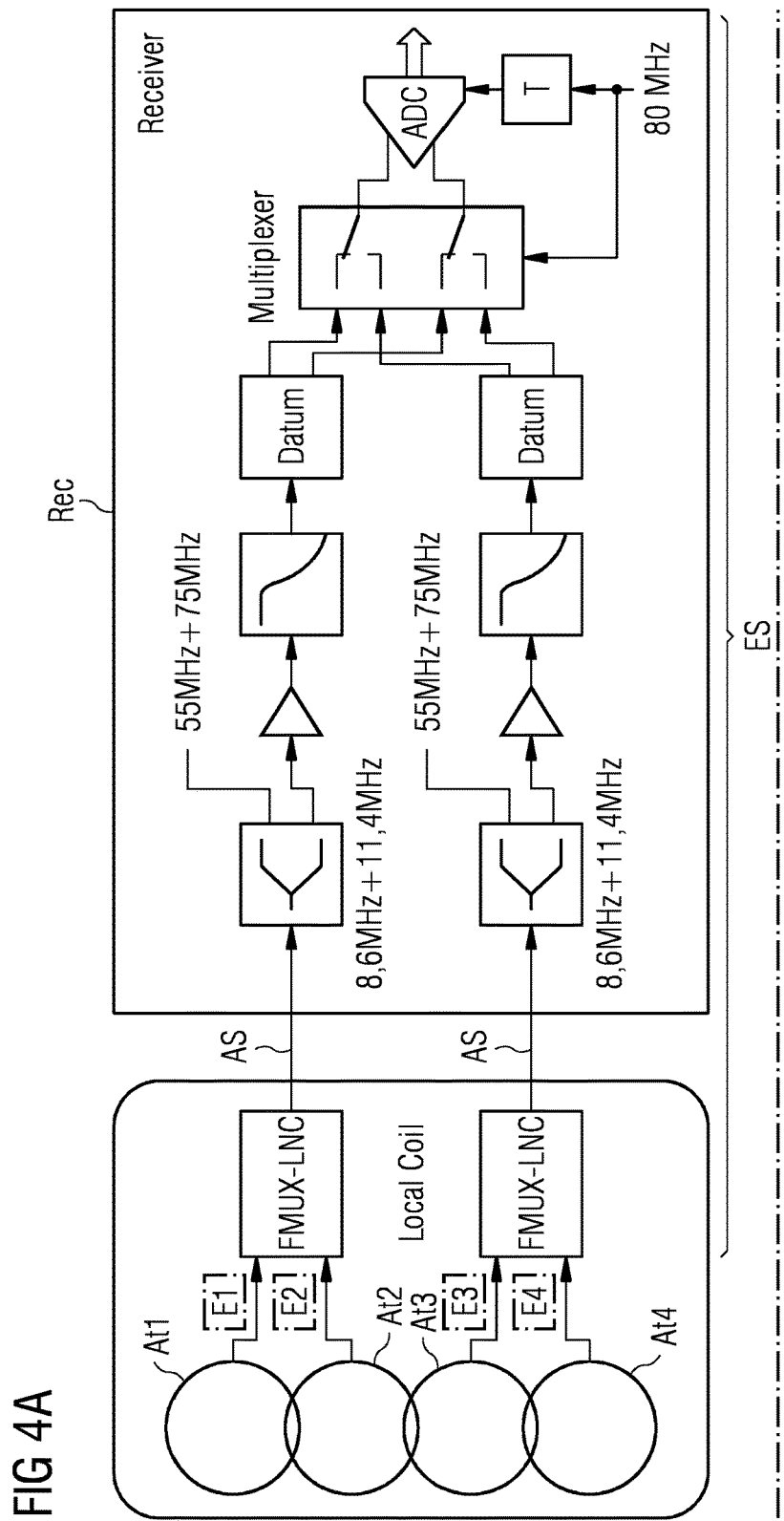
FIG. 4A depicts an example of a receiving system including one part in a local coil on the left-hand side and a receiver part in, e.g., a MRT on the right hand side.
Figure 4B:
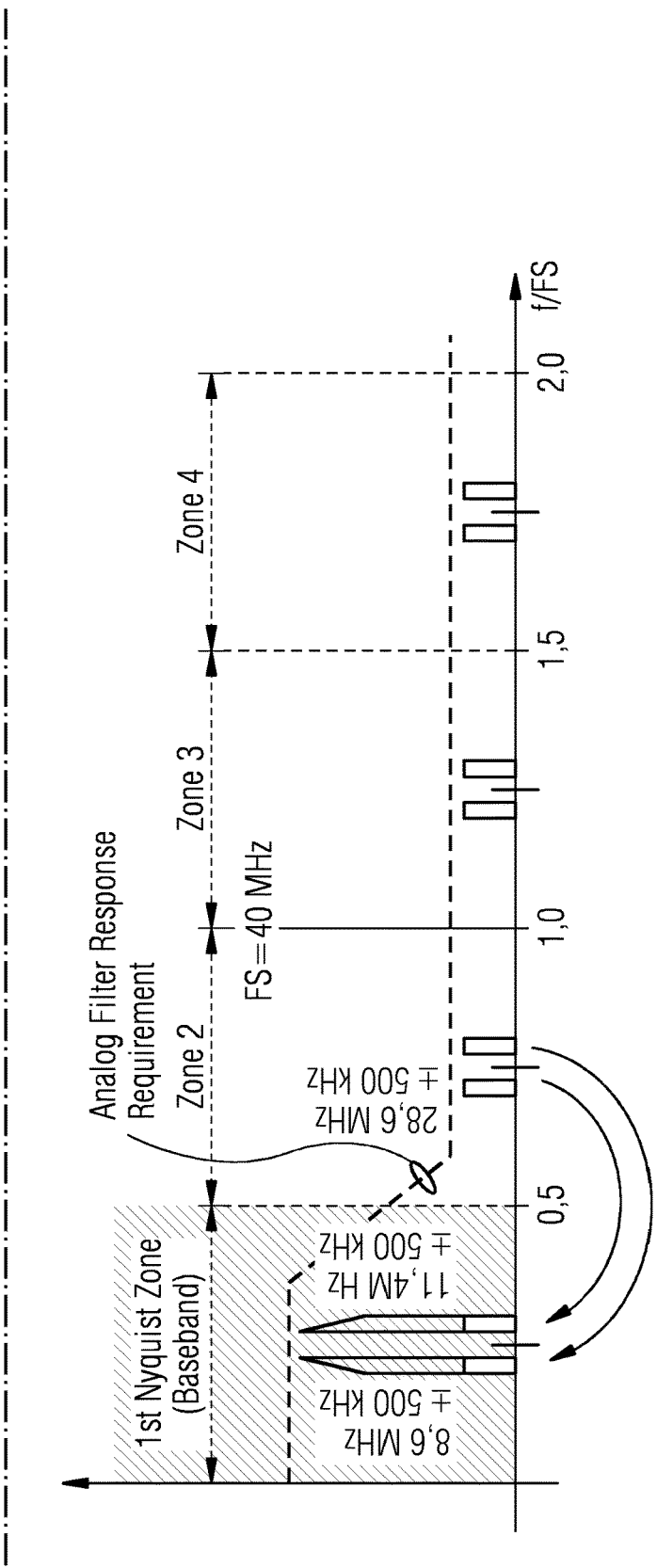
FIG. 4B depicts a frequency plan associated with the receiving system of FIG. 4A.

Combination of frequency multiplexing and time multiplexing with synchronous sampling is depicted, for example in FIGS. 3, 4A, and 4B. It is also possible advantageously to combine both multiplexing methods. An example is depicted in FIG. 3 with a 1T5 MRI receiver using 2:1 frequency multiplexing combined with 2:1 time multiplexing. In this type of configuration, for example, the MR frequency band is 63.6 MHz±250 kHz, the local oscillator frequencies LO1=55 MHz, LO2=75 MHz, the intermediate frequencies ZF1=8.6 MHz, ZF2=11.4 MHz, the ADC sampling rate FS−ADC=80 MS/s, and the sampling rate per signal path FS−Sig=40 MS/s. In the block schematic diagram, the analog part of the receiving system includes, e.g., frequency multiplexing LNCs (e.g., FMUX-LNCs include LNAs, filters, mixers, diplexers), amplifiers, filters and multiplexer. On the right-hand side of FIG. 3, the gain $G_0$ of the amplifier LNA is 3 dB lower than on the left-hand side of FIG. 3.

FIG. 4B depicts a frequency plan for sampling at 40 MS/s per signal path. FIG. 4B depicts the two intermediate frequency bands of the frequency multiplexing signal, the associated alias bands, and outlines the frequency response course of the anti-alias filter.

The reduction in the usable dynamic range is composed of the components of the two multiplexing methods (where MFMUX=2 and MTMUX=2):

$$\text{DeltaDR} = \Delta \text{DR} = 20 \times \log(\tfrac{1}{2}) + 10 \times \log(\tfrac{1}{2}) = -9 \text{ dB}$$

According to embodiments, the possibility of reducing the number of signal paths required (e.g., ADCs) by multiplexing methods may be achieved at the cost of reducing the usable dynamic range of the receiver. The above-described MR-specific dependency of the signal dynamic range on the MR sequence and on the coil size/density allows the individual multiplexer factors M to be configured to the requirements of the MR measurement. (A) For MR measurements requiring a large number of coils, large multiplexer factors M are selected. Here, the receiving system need only provide a relatively limited usable dynamic range in a comparatively large number of local coil paths. The dynamic range "headroom" that is not required may be exchanged for a high number of channels (large M). (B) For MR measurements requiring a large usable dynamic range, small multiplexer factors M are selected. Here, the receiving system has to provide a relatively large usable dynamic range in comparatively few local coil paths in each case. The signal paths that are not required may be exchanged for an increase in usable dynamic range (large M).

This idea may be implemented in a particularly effective and simple manner in frequency multiplexing architectures.

For the application case (A), the local coil is constructed according to the block schematic diagram depicted on the left-hand side of FIG. 2, for example. In other words, two local coil signals are amplified separately in associated LNAs and mixers, converted into respectively individual intermediate frequency bands, combined in a shared signal path by a diplexer, and analog-digital converted together. As a result of this, the usable amplitude dynamic range per local coil path decreases by −6 dB (e.g., by $20 \times \log(1/M)$ [dB]) in comparison with the application case (B). (See also FIG. 2.)

For the application case (B), the local coil only contains one local coil element per signal path (e.g., corresponding to the block schematic diagram on the right-hand side of FIG. 2). The local coil signal is amplified, converted into an intermediate frequency range, and analog-digital converted individually. The amplitude dynamic range of the receiving system may be used entirely for a local coil signal.

In time multiplexing architectures, for the application case (B), every, e.g., second multiplexer time slot is skipped or the multiplexer is statically set to a signal path. The sampling rate per signal path thereby increases by the factor 2, or by the factor M. As explained above, the ADC noise floor decreases as a result of this measure by $10 \times \log(\tfrac{1}{2})$, or by $10 \times \log(1/M)$ (specified in [dB]). In order that the increase of the dynamic range in the receiving system may be fully utilized, the cascade amplification ahead of the ADC is reduced by $10 \times \log(1/M)$ (specified in [dB]). The receiving system may be operated at a level that is $10 \times \log(M)$ [dB] higher, before the operating limit of the ADC is reached. Since the noise floor of the receiving system (e.g., or the noise figure) remains almost unchanged, this has the same significance as increasing the receive path dynamic range by 10×log(M) [dB] (specified precondition: noise figure of the ADC>>1 and noise figure of the LNA largely independent of the selected LNA amplification).

A combination of both measures is also possible.

Existing MR systems use a fixed sampling rate for the purpose of digitizing the receive signal. In this case, the sampling rate defines fundamental properties of the system (e.g., frequency plan, dynamic range, power consumption, selection of components, costs). Since the most demanding dynamic range requirements only arise for specific applications, which do not necessarily require the maximum number of receive channels, it is possible to configure the sampling rate of the ADC to the application and, in the case of high expected signal levels, to increase the sampling rate for this type of sequences accordingly and to reduce the receive path cascade amplification (see above). The solution variant depicted here exemplifies the way in which the sampling rate may be varied by using a multiplexer in different ways, the multiplexer being connected upstream of the ADC.

The sampling rate (e.g., either the ADC sampling rate directly or the effective sampling rate with a multiplexer connected upstream) and the receive path cascade amplification may be controlled by a parameter that may be set in the sequence of the MR system. This software parameter is forwarded to the receiver (e.g., in the electronics cabinet, in the couch or in the coil) via the control system.

In particular, the following embodiments are also possible: (1) choosing the individual multiplexer factors as a function of the requirements on the MR measurement in respect of coil density and signal dynamic range, and (2) exchanging usable receiving system dynamic range for number of available channels and vice versa The embodiments may be implemented by (1) non-assignment of receive channels (frequency multiplexing), e.g., "high-density LC" vs. "high-power LC," (2) skipping individual signal paths, or static routing (time multiplexing) and configuration of the cascade amplification, or (3) a combination of both methods.

The following exemplary advantages may be derived from embodiments. The requirements on the usable dynamic range of the receive chain may be reduced without restricting the performance of the MR system. This has the following effects: (1) cost reduction, (2) the power consumption of the LNCs of the "high-density LCs" decreases, (3) less dissipated heat (patient comfort), (4) the power consumption is highly critical in the application case of a wireless LC (e.g., wireless coil), (5) the requirement on the ADC dynamic range decreases (the ADC may represent the bottleneck), (6) ADC costs are reduced, and/or (7) ADC resolution and/or sampling rate may be reduced (e.g., the data rate and the power consumption are highly critical in the application case of a digital wireless LC).

Sampling rates of an analog-digital converter ADC for the purpose of sampling at least one receive signal E1, E2; E1, E2, E3, E4; E4 may be signal-specific sampling rates, for example, in so far as they may be variable as a function of properties of receive signals, e.g. the expected dynamic range, expected maximum or number thereof.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A receiving system for an imaging magnetic resonance tomography system, the receiving system comprising:
at least one analog-digital converter; and
at least one multiplexer entity for receive signals, wherein the receive signals come from respective antennas of a local coil, and wherein the receive signals are configured to be switched to the at least one analog-digital converter,
wherein sampling rates of the analog-digital converter for sampling at least one receive signal are configured to be changed by varying a sampling rate of the at least one receive signal in a context of an analog-digital conversion by changing a number of receive signals, a number of antennas, or the number of receive signals and the number of antennas present at or multiplexed by at least one multiplexer connected upstream of the at least one analog-digital converter.

2. The receiving system as claimed in claim 1, wherein the sampling rates of the analog-digital converter are signal-specific sampling rates.

3. The receiving system as claimed in claim 1, wherein the sampling rate of the least one receive signal is configured to be changed by the at least one analog-digital converter.

4. The receiving system as claimed in claim 1, wherein the sampling rates of the at least one analog-digital converter are configured to be changed as a function of a height, dynamic range, or the height and the dynamic range of expected signal levels of the receive signals.

5. The receiving system as claimed in claim 1, wherein one or more of the following are configured to be varied by signals transmitted from a control unit of the magnetic resonance tomography device to the receiving system: (1) a signal-specific sampling rate of the analog-digital converter; (2) an amplification of at least one receive signal of the receive signals configured to be switched to the analog-digital converter, or (3) the number of receive signals switched through to the analog-digital converter by the at least one multiplexer connected upstream of the analog-digital converter.

6. The receiving system as claimed in claim 5, wherein the signals are transmitted from the control unit in a form of an activation sequence.

7. The receiving system as claimed in claim 1, wherein time multiplexing, frequency multiplexing, or both time and frequency multiplexing for receive signals from local coil antennas are provided in a receive path.

8. The receiving system as claimed in claim 7, wherein the time multiplexing, the frequency multiplexing, or both the time and frequency multiplexing are provided in order to transfer receive signals from a plurality of local coil antennas on a signal path.

9. The receiving system as claimed in claim 1, wherein for MRT measurements using a first number of local coil antennas,
multiplexer factors, the number of local coil antennas at the multiplexer configured to be switched through to an analog-digital converter, or both the multiplexer factors and the number of local coil antennas at the multiplexer are configured to be selected to be larger than in the case of MRT measurements using a comparatively lower number of local coil antennas than the first number.

10. The receiving system as claimed in claim 1, wherein when frequency multiplexing receive signals in a receive path from the local coil antennas to a receiver, depending on the number of receive signals involved in a MRT measurement, more or fewer receive signals are jointly present at an element configured to transfer the receive signals to the analog-digital converter concurrently, all at different frequencies.

11. The receiving system as claimed in claim 1, wherein the receive signals of the respective local coil antennas are contained in a specific section of time slots at an output of the multiplexer.

12. The receiving system as claimed in claim 11, wherein receive signals of only one of the local coil antennas are contained in each time slot.

13. The receiving system as claimed in claim 1, wherein an amplification of the receive signals in an amplifier upstream of the analog-digital converter is selected as a function of at least one of: (1) an intended dynamic range of the receive signals during a MRT measurement or (2) the number of local coil antennas used for the MRT measurement.

14. The receiving system as claimed in claim 1, wherein signal-specific sampling rates of the analog-digital converter are configured to be changed for sampling at least one of the receive signals, wherein a sampling frequency of the analog-digital converter is independent of, unchanged by, or independent of and unchanged by the number of receive signals, the number of antennas, or the number of receive signals and the number of antennas present at the analog-digital converter for the analog-digital conversion.

15. The receiving system as claimed in claim 1, wherein an amplification of the receive signals is configured to be increased or decreased by a factor as a function of a height of expected signal levels of the receive signals in the at least one receive channel.

16. The receiving system as claimed in claim 1, wherein when fewer than all of a plurality of possible receive signals transferred using a time multiplexing, and/or antennas producing receive signals are present at the analog-digital converter for the analog-digital conversion,
an amplifier for amplification of the respective receive signals has a lower amplification than when all of the receive signals and/or antennas producing the receive signals are present at the analog-digital converter for the analog-digital conversion.

17. The receiving system as claimed in claim 1, wherein when fewer by a factor F than all of a plurality of receive signals transferred using the frequency multiplexing method and/or antennas producing receive signals are present at the analog-digital converter for the analog-digital conversion, the remaining receive signals have a voltage level that is higher by 1/F than when all of the receive signals are present at the analog-digital converter for analog-digital conversion.

18. The receiving system as claimed in claim 17, wherein F=2.

19. A method for forwarding receive signals received by an imaging magnetic resonance tomography system, the method comprising:
multiplexing a plurality of receive signals by a multiplexer entity, wherein the plurality of receive signals come from at least one antenna and are configured to be switched to an analog-digital converter; and
adapting a sampling rate for sampling at least one of the receive signals, wherein the sampling rate is changed by varying a sampling rate of the at least one receive signal in a context of an analog-digital conversion by changing a number of receive signals, a number of antennas, or the number of receive signals and the number of antennas present at or multiplexed by at least one multiplexer connected upstream of the at least one analog-digital converter.

* * * * *